(12) United States Patent
Miyata et al.

(10) Patent No.: US 8,659,174 B2
(45) Date of Patent: Feb. 25, 2014

(54) SEMICONDUCTOR DEVICE

(71) Applicant: Rohm Co., Ltd., Kyoto (JP)

(72) Inventors: Osamu Miyata, Kyoto (JP); Shingo Higuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/851,993

(22) Filed: Mar. 28, 2013

(65) Prior Publication Data

US 2013/0221530 A1    Aug. 29, 2013

Related U.S. Application Data

(60) Continuation of application No. 13/274,738, filed on Oct. 17, 2011, now Pat. No. 8,432,046, which is a division of application No. 11/992,985, filed as application No. PCT/JP2006/319801 on Oct. 3, 2006, now Pat. No. 8,063,495.

(30) Foreign Application Priority Data

Oct. 3, 2005   (JP) ................................. 2005-290167
Dec. 9, 2005   (JP) ................................. 2005-356651
Oct. 3, 2006   (JP) ................................. 2006-271658

(51) Int. Cl.
   *H01L 23/52*   (2006.01)
   *H01L 23/48*   (2006.01)
   *H01L 29/40*   (2006.01)

(52) U.S. Cl.
   USPC .................. 257/781; 257/E23.022; 257/778; 438/614

(58) Field of Classification Search
   USPC ............. 257/E23.022, E23.06, E23.068, 737, 257/738, 762, 774, 778–781, 784, 786; 438/108, 612, 614, 617
   See application file for complete search history.

(56) References Cited

U.S. PATENT DOCUMENTS

| | | | |
|---|---|---|---|
| 5,656,863 A * | 8/1997 | Yasunaga et al. | 257/778 |
| 6,071,755 A | 6/2000 | Baba et al. | |
| 6,198,169 B1 * | 3/2001 | Kobayashi et al. | 257/780 |
| 6,319,749 B1 | 11/2001 | Shigeta et al. | |
| 6,338,980 B1 | 1/2002 | Satoh | |
| 6,380,061 B1 | 4/2002 | Kobayashi et al. | |
| 6,429,532 B1 | 8/2002 | Han et al. | |
| 6,458,622 B1 * | 10/2002 | Keser et al. | 438/106 |
| 6,479,900 B1 | 11/2002 | Shinogi et al. | |
| 6,482,730 B1 | 11/2002 | Masumoto et al. | |

(Continued)

FOREIGN PATENT DOCUMENTS

| | | |
|---|---|---|
| JP | 10-242332 | 9/1998 |
| JP | 2000-183094 | 6/2000 |

(Continued)

*Primary Examiner* — Chris Chu
(74) *Attorney, Agent, or Firm* — Rabin & Berdo, P.C.

(57) ABSTRACT

There is provided a semiconductor device with which stress can be prevented from locally concentrating on an external connecting terminal on a post and thus damages of the external connecting terminal can be prevented. The semiconductor device includes a semiconductor chip, a sealing resin layer stacked on a surface of the semiconductor chip, and the post which penetrates the sealing resin layer in a stacking direction of the semiconductor chip and the sealing resin layer, protrudes from the sealing resin layer, and has a periphery of the protruding portion opposedly in contact with a surface of the sealing resin layer in the stacking direction.

27 Claims, 8 Drawing Sheets

(56) References Cited

U.S. PATENT DOCUMENTS

| | | | |
|---|---|---|---|
| 6,501,185 B1 | 12/2002 | Chow et al. | |
| 6,503,779 B2 | 1/2003 | Miyazaki | |
| 6,518,162 B2 | 2/2003 | Ono et al. | |
| 7,115,998 B2 | 10/2006 | Hiatt et al. | |
| 7,227,736 B2 | 6/2007 | Shioga et al. | |
| 7,582,972 B2 | 9/2009 | Watanabe | |
| 8,072,068 B2 * | 12/2011 | Sakamoto | 257/737 |
| 2002/0038890 A1 | 4/2002 | Ohuchi | |
| 2002/0121709 A1 | 9/2002 | Matsuki et al. | |
| 2002/0151164 A1 * | 10/2002 | Jiang et al. | 438/613 |
| 2003/0071352 A1 * | 4/2003 | Ohuchi et al. | 257/737 |
| 2003/0080422 A1 | 5/2003 | Ohara | |
| 2003/0092219 A1 * | 5/2003 | Ohuchi et al. | 438/110 |
| 2003/0151141 A1 | 8/2003 | Matsuki et al. | |
| 2003/0205730 A1 | 11/2003 | Ohuchi | |
| 2003/0214795 A1 * | 11/2003 | Sakuyama | 361/767 |
| 2004/0207088 A1 * | 10/2004 | Morozumi | 257/758 |
| 2006/0014320 A1 * | 1/2006 | Yamano et al. | 438/113 |
| 2008/0128917 A1 * | 6/2008 | Yamano | 257/778 |

FOREIGN PATENT DOCUMENTS

| | | |
|---|---|---|
| JP | 2000-188357 | 7/2000 |
| JP | 2000-243729 A | 9/2000 |
| JP | 2001-127206 | 5/2001 |
| JP | 2001-210760 | 8/2001 |
| JP | 2001-291733 A | 10/2001 |
| JP | 2001-298120 | 10/2001 |
| JP | 2002-110951 | 4/2002 |
| JP | 2002-203925 | 7/2002 |
| JP | 2003-204014 | 7/2003 |
| JP | 2004-273591 A | 9/2004 |
| JP | 2005-216941 A | 8/2005 |

* cited by examiner

SEMICONDUCTOR DEVICE

CROSS-REFERENCE TO RELATED APPLICATION

This application is a continuation of application Ser. No. 13/274,738, filed Oct. 17, 2011, which is a divisional of application Ser. No. 11/992, 985, filed on Apr. 2, 2008 (now U.S. Pat. No. 8,063,495, issued Nov. 22, 2011). Furthermore, this application claims the benefit of priority of Japanese applications 2005-290167, filed on Oct. 3, 2005, 2005-356651, filed on Dec. 9, 2005, and 2006-271658, filed on Oct. 3, 2006. The disclosures of these prior U.S. and Japanese applications are incorporated herein by reference.

TECHNICAL FIELD

The present invention relates to a semiconductor device, and more particularly, it relates to a semiconductor device to which the WL-CSP (Wafer Level-Chip Scale Package) technique is applied.

BACKGROUND ART

With the recent improvement and multiplication in function of a semiconductor device, the WL-CSP (Wafer Level-Chip Scale Package) technique has been increasingly practicalized. According to the WL-CSP technique, the packaging step is completed in a wafer state, and the size of each chip cut out from the wafer by dicing is the package size.

A semiconductor device to which the WL-CSP technique is applied includes a semiconductor chip 92 whose surface is entirely covered with a passivation film 91, a polyimide layer 93 stacked on the passivation film 91, rewiring 94 formed on the polyimide layer 93, a sealing resin layer 95 stacked on the polyimide layer 93 and the rewiring 94 and a solder ball 96 arranged on the sealing resin layer 95, as shown in FIG. 13. The passivation film 91 is provided with a pad opening 98 for exposing a part of the internal wiring as an electrode pad 97. The rewiring 94 is connected to the electrode pad 97 through a through-hole 99 penetratingly formed in the polyimide layer 93. Further, the rewiring 94 is connected with the solder ball 96 through a post 100 penetrating the sealing resin layer 95. In this semiconductor device, the solder ball 96 is connected to a pad provided on a mounting board, thereby attaining mounting on the mounting board (electrical and mechanical connection to the mounting board).

In the process of manufacturing such a semiconductor device, a wafer provided with a plurality of semiconductor chips is prepared. In this wafer state, the polyimide layer 93 and the rewiring 94 are first formed on the passivation film 91 covering the surface of the wafer. Then, the post 100 is formed on a predetermined position of the rewiring 94 by a method such as plating. Thereafter epoxy resin employed as the material for the sealing resin layer 95 is supplied to the surface of the wafer for embedding the post 100 therein. After the epoxy resin is cured, the surface of the epoxy resin is ground with a grinder, and the surface (tip end surface) of the post 100 is exposed from the epoxy resin.

However, a metallic material such as copper forming the post 100 has ductility, whereby the tip end of the post 100 extends and spreads (sags) on the surface of the epoxy resin (sealing resin layer 95) due to the grinder at the time of grinding the epoxy resin, as shown by a phantom line in FIG. 13. Such sagging of the metallic material may cause a problem such as a short circuit between a plurality of posts 100, for example.

After the epoxy resin is ground with the grinder, therefore, an ammonia-based etching solution is supplied to the surface of the wafer, and etching is performed for removing the metallic material extending and spreading on the surface of the epoxy resin. After this etching, the solder ball 96 is formed on the post 100. Then, the wafer is cut (diced) along dicing lines set between the adjacent semiconductor chips in the wafer. Thus, the semiconductor device having the structure shown in FIG. 13 is obtained.

After the etching, the position of the tip end surface of the post 100 is lower by one step than the position of the surface of the sealing resin layer 95, as shown in FIG. 13. Therefore, a corner 90 formed by the surface of the sealing resin layer 95 and another surface (inner surface of a through-hole receiving the post 100) of the sealing resin layer 95 in contact with the side surface of the post 100 comes into contact with the proximal end of the solder ball 96 formed on the post 100. If this corner 90 is in contact with the solder ball 96, stress may concentrate on the contact portion between the corner 90 and the solder ball 96 when the semiconductor chip 92 or the mounting board undergoes thermal expansion/shrinkage or the like, thereby causing a damage such as cracking in the solder ball 96.

FIG. 14 is a sectional view showing another structure of a semiconductor device to which the WL-CSP technique is applied.

This semiconductor device includes a semiconductor chip 101. The entire surface of the semiconductor chip 101 is covered with a passivation film 102. This passivation film 102 is provided with pad openings 104 for exposing pads 103.

A polyimide layer 105 is stacked on the passivation film 102. Rewirings 106 are formed on the polyimide layer 105. These rewirings 106 are connected to the pads 103 through through-holes 107 penetratingly formed in the polyimide layer 105.

On the other hand, a first wiring layer 109, a first interlayer film 110, a second wiring layer 111 and a second interlayer film 112 are stacked under the passivation film 102 successively from the side closer to a semiconductor substrate 108 serving as the base of the semiconductor chip 101. The first wiring layer 109 and the second wiring layer 111 are electrically connected with each other through via holes 113 formed in the first interlayer film 110. The second wiring layer 111 and the pads 103 are electrically connected with each other through via holes 114 formed in the second interlayer film 112.

A sealing resin layer 115 made of epoxy resin is stacked on the polyimide layer 105 and the rewirings 106. The rewirings 106 are connected to solder balls 117 arranged on the surface of the sealing resin layer 115 through posts 116 penetrating the sealing resin layer 115.

In this semiconductor device of such a multilevel interconnection structure, the side surfaces of the semiconductor chip 101, the passivation film 102, the first interlayer film 110, the second interlayer film 112 and the sealing resin layer 115 are flush with one another and exposed. When stress is applied to the side surface of the semiconductor device, therefore, cracking (separation of the passivation film 102, the first interlayer film 110 and the second interlayer film 112) between each of the passivation film 102, the first interlayer film 110 and the second interlayer film 112 and the underlayer thereof takes place on the side surface. If such cracking progresses up to an element forming region of the semiconductor chip 101, a malfunction of a functional element formed on the element forming region may be caused.

Patent Document 1: Japanese Unexamined Patent Publication No. 2001-210760

Patent Document 2: Japanese Unexamined Patent Publication No. 2001-298120

DISCLOSURE OF THE INVENTION

Problems to be Solved by the Invention

Accordingly, a first object of the present invention is to provide a semiconductor device capable of preventing stress from locally concentrating on an external connecting terminal provided on a post, thereby preventing the external connecting terminal from being damaged.

A second object of the present invention is to provide a semiconductor device capable of preventing cracking between each of a passivation film and interlayer films and the underlayer thereof.

Means for Solving the Problems

The semiconductor device according to the present invention for attaining the above-described first object includes: a semiconductor chip; a sealing resin layer stacked on the surface of this semiconductor chip; a post penetrating this sealing resin layer in the stacking direction of the semiconductor chip and the sealing resin layer and protruding from the sealing resin layer, the periphery of the protruding portion being opposedly in contact with the surface of the sealing resin layer in the stacking direction; and an external connecting terminal provided on the sealing resin layer and connected to the post.

According to this structure, the periphery of the portion of the post protruding from the sealing resin layer is opposedly in contact with the surface of the sealing resin layer in the stacking direction of the semiconductor chip and the sealing resin layer. Therefore, a corner formed by the surface of the sealing resin layer and another surface (inner surface of a hole receiving the post) of the sealing resin layer in contact with the side surface of the post comes into contact with the boundary between the portion of the post embedded in the sealing resin layer and the portion protruding from the sealing resin layer, to be covered with the post. Therefore, the corner can be prevented from coming into contact with the external connecting terminal. When the semiconductor chip or a mounting board mounted with this semiconductor device undergoes thermal expansion/shrinkage or the like, concentrating on the external connecting terminal. Consequently, the external connecting terminal can be prevented from being damaged resulting from such stress concentration.

The post may have a structure which includes an embedded portion embedded in the sealing resin layer and a protrusion connected to this embedded portion and having a tip end protruding from the sealing resin layer. In this case, the protrusion preferably has higher rigidity than the external connecting terminal. If the rigidity of the protrusion is high, the protrusion can be effectively prevented from being damaged resulting from stress concentration from the corner of the sealing resin layer.

Preferably in the structure including the embedded portion and the protrusion, the embedded portion is provided in a through-hole formed in the sealing resin layer with a clearance between the embedded portion and the inner surface of the through-hole, and the protrusion enters the clearance between the embedded portion and the inner surface of the through-hole. Since the protrusion enters the clearance between the embedded portion and the inner surface of the through-hole, the protrusion has no right-angled corner in contact with the tip end surface of the embedded portion and the inner surface of the through-hole on the portion connected with the embedded portion. Thus, stress can be prevented from locally concentrating on the portion of the protrusion connected with the embedded portion when the semiconductor chip or the mounting board mounted with this semiconductor device undergoes thermal expansion/shrinkage or the like.

The embedded portion and the protrusion may be made of the same material, or may be made of different materials.

The post may have a structure which includes a columnar portion having a tip end protruding from the sealing resin layer and a cladding portion covering the tip end of this columnar portion. In this case, the columnar portion may have a first columnar portion embedded in the sealing resin layer and a second columnar portion connected to this first columnar portion and having a tip end protruding from the sealing resin layer. Further, the cladding portion may have a first cladding portion covering the tip end of the columnar portion and a second cladding portion covering the surface of this first cladding portion.

Preferably in the structure including the columnar portion and the cladding portion, the columnar portion is provided in a through-hole formed in the sealing resin layer with a clearance between the columnar portion and the inner surface of the through-hole, and the cladding portion enters the clearance between the columnar portion and the inner surface of the through-hole. Since the cladding portion enters the clearance between the columnar portion and the inner surface of the through-hole, the cladding portion has no right-angled corner in contact with the tip end surface of the columnar portion and the inner surface of the through-hole on the portion connected with the columnar portion. Thus, stress can be prevented from locally concentrating on the portion of the cladding portion connected with the columnar portion when the semiconductor chip or the mounting board mounted with this semiconductor device undergoes thermal expansion/shrinkage or the like.

The columnar portion and the cladding portion may be made of the same material, or may be made of different materials. The first columnar portion and the second columnar portion may also be made of the same material, or may be made of different materials. Further, the first cladding portion and the second cladding portion may also be made of the same material, or may be made of different materials.

The semiconductor device according to the present invention for attaining the above-described second object includes a semiconductor chip having a trench opening toward the surface side and the side surface side on the periphery of the surface thereof; and a sealing resin layer stacked on this semiconductor chip to enter the trench for sealing the surface side of the semiconductor chip, while the semiconductor chip includes a semiconductor substrate serving as the base of the semiconductor chip, a plurality of wiring layers vertically stacked on this semiconductor substrate, an interlayer film interposed between the wiring layers, and a passivation film covering the surface of the uppermost wiring layer, and the portion of the sealing resin layer entering the trench covers the side surfaces of the interlayer film and the passivation film.

According to this structure, the trench is formed in the periphery of the surface of the semiconductor chip, and the sealing resin layer enters this trench. Thus, the side surface of the surface layer portion of the semiconductor chip, i.e., the respective side surfaces of the interlayer films and the passivation film are covered with the sealing resin layer entering the trench. Therefore, cracking between each of the passivation film and the interlayer films and the underlayer thereof can be prevented.

Preferably, the semiconductor device further includes a plurality of posts penetrating the sealing resin layer in the stacking direction of the semiconductor chip and the sealing resin layer, and each having a base end electrically connected with the uppermost wiring layer; and external connecting terminals formed in contact with the respective tip ends of the posts and protruding from the sealing resin layer, while the sealing resin layer is formed by applying uncured liquid resin to the surface of the semiconductor chip and curing the same.

According to this structure, since the liquid resin is employed as the material for the sealing resin layer, the liquid resin can excellently enter the space between the adjacent posts of the plurality of posts and the trench. Consequently, the space between the adjacent posts of the plurality of posts and the trench can be reliably filled up with the sealing resin layer.

The semiconductor device according to the present invention for attaining the first and second objects includes: a semiconductor chip having a trench opening toward the surface side and the side surface side on the periphery of the surface thereof; a sealing resin layer stacked on this semiconductor chip to enter the trench for sealing the surface side of the semiconductor chip; a plurality of posts penetrating the sealing resin layer in the stacking direction of the semiconductor chip and the sealing resin layer, each having a base end electrically connected with the uppermost wiring layer, and protruding from the sealing resin layer, the peripheries of the protruding portions being opposedly in contact with the surface of the sealing resin layer in the stacking direction; and external connecting terminals formed in contact with the respective tip ends of the posts and protruding from the sealing resin layer, while the semiconductor chip includes a semiconductor substrate serving as the base of the semiconductor chip, a plurality of wiring layers vertically stacked on this semiconductor substrate, an interlayer film interposed between the wiring layers, and a passivation film covering the surface of the uppermost wiring layer, and the portion of the sealing resin layer entering the trench covers the side surfaces of the interlayer film and the passivation film.

According to this structure, the peripheries of the portions of the posts protruding from the sealing resin layer are opposedly in contact with the surface of the sealing resin layer in the stacking direction of the semiconductor chip and the sealing resin layer. Therefore, a corner formed by the surface of the sealing resin layer and another surface (inner surface of a hole receiving the post) of the sealing resin layer in contact with the side surface of each post comes into contact with the boundary between the portion of the post embedded in the sealing resin layer and the portion protruding from the sealing resin layer, and is covered with the post. Therefore, the corner can be prevented from coming into contact with the external connecting terminal. When the semiconductor chip or a mounting board mounted with this semiconductor device undergoes thermal expansion/shrinkage or the like, therefore, stress can be prevented from locally concentrating on the external connecting terminals. Consequently, the external connecting terminals can be prevented from being damaged resulting from such stress concentration.

Further, the trench is formed in the periphery of the surface of the semiconductor chip, and the sealing resin layer enters this trench. Thus, the side surface of the surface layer portion of the semiconductor chip, i.e., the side surfaces of the interlayer films and the passivation film are covered with the sealing resin layer entering the trench. Therefore, cracking between each of the passivation film and the interlayer films and the underlayer thereof can be prevented.

The foregoing and other objects, features and effects of the present invention will become more apparent from the following description of the embodiments with reference to the attached drawings.

Figure 1:
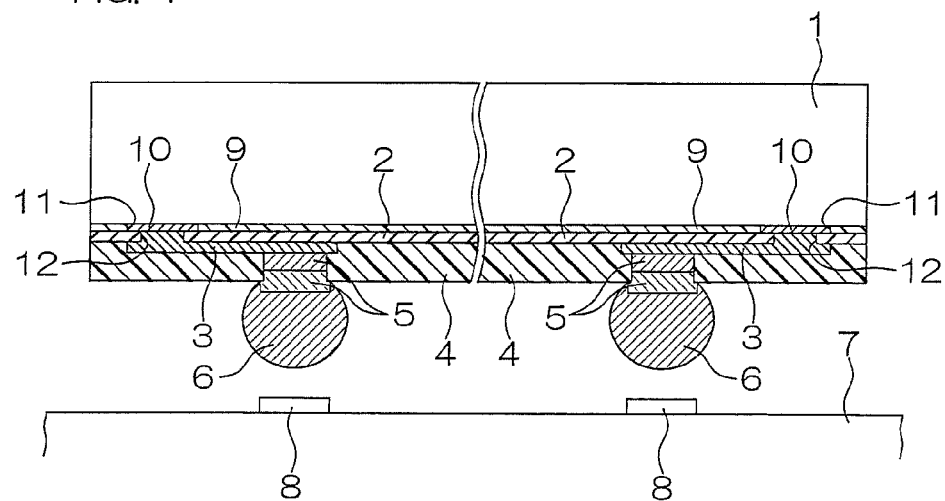
FIG. 1 A schematic diagram showing the structure of a semiconductor device according to an embodiment of the present invention.

DESCRIPTION OF THE REFERENCE NUMERALS 1 semiconductor chip
4 sealing resin layer
5 post
6 metal ball
13 periphery
14 embedded portion
15 protrusion
16 corner
17 first columnar portion
18 second columnar portion
19 cladding portion
20 columnar portion
21 first cladding portion 22 second cladding portion
41 through-hole
201 semiconductor chip
204 sealing resin layer
205 metal ball (external connecting terminal)
211 semiconductor substrate
212 first wiring layer
213 first interlayer film
214 second wiring layer
215 second interlayer film
216 third wiring layer
217 third interlayer film
218 fourth wiring layer
222 passivation film
231 trench
233 post

BEST MODE FOR CARRYING OUT THE INVENTION

Embodiments of the present invention are now described in detail with reference to the accompanying drawings.

FIG. 1 is a schematic sectional view showing the structure of a semiconductor device according to an embodiment of the present invention.

This semiconductor device is produced by the WL-CSP (Wafer Level-Chip Scale Package) technique. This semiconductor device includes a semiconductor chip 1, a stress relaxation layer 2 stacked on the semiconductor chip 1, a plurality of rewirings 3 arranged on the stress relaxation layer 2, a sealing resin layer 4 stacked on the stress relaxation layer 2 and the rewirings 3, a plurality of posts 5 provided by penetrating the sealing resin layer 4, and metal balls 6 provided as external connecting terminals on the sealing resin layer 4 and connected to the respective posts 5. In this semiconductor device, the respective metal balls 6 are connected to pads 8 provided on a mounting board 7, thereby attaining mounting on the mounting board 7 (electrical and mechanical connection to the mounting board 7).

The semiconductor chip 1 is a silicon chip generally rectangular in plan view, for example. This semiconductor chip 1 has a passivation film (surface protective film) 9 made of silicon oxide or silicon nitride on the outermost layer. This passivation film 9 is provided with a plurality of pad openings 11 for partially exposing internal wirings electrically connected with functional elements built in the semiconductor chip 1 as electrode pads 10.

The stress relaxation layer 2 is made of polyimide, for example. This stress relaxation layer 2 is formed so as to cover the entire surface of the passivation film 9, and has a function of absorbing and relaxing stress applied to this semiconductor device. Through-holes 12 are penetratingly formed in the stress relaxation layer 2 on positions opposed to the respective electrode pads 10.

The rewirings 3 are made of a metallic material such as copper, for example. The rewirings 3 extend on the surface of the stress relaxation layer 2 from the respective through-holes to the positions provided with the respective posts 5. One ends of the rewirings 3 are electrically connected with the respective electrode pads 10 through the through-holes 12.

The sealing resin layer 4 is made of epoxy resin, for example. This sealing resin layer 4 is formed so as to cover the surfaces of the stress relaxation layer 2 and the rewirings 3, and seals the surface side of the semiconductor chip 1 in this semiconductor device. In this sealing resin layer 4, through-holes 41 each having a cylindrical inner surface, for example, are penetratingly formed in a direction perpendicular to the surface of the semiconductor chip 1 on the rewirings 3. Further, this sealing resin layer 4 has a planar surface, and the side surface thereof is flush with the side surface of the semiconductor chip 1. Thus, this semiconductor device is generally in the form of a rectangular parallelepiped having a size equal to the size of the semiconductor chip 1 in plan view.

Figure 2:
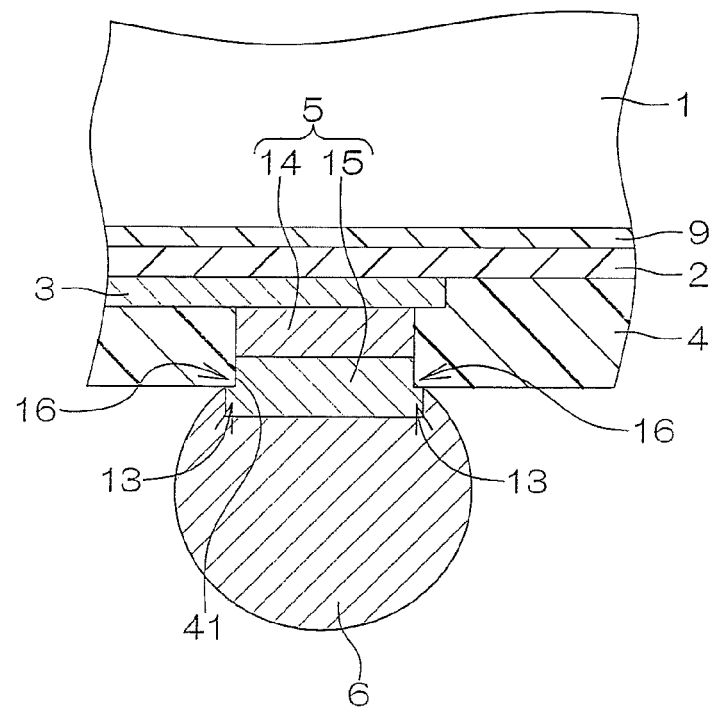
FIG. 2 A schematic sectional view of a portion around each post in the semiconductor device shown in FIG. 1.

FIG. 2 is a schematic sectional view of a portion around each post 5.

The post 5 is made of a metallic material. The post 5 is arranged in the through-hole 41, and penetrates the sealing resin layer 4 in the stacking direction (hereinafter simply referred to as "stacking direction") of the semiconductor chip 1 and the sealing resin layer 4. The tip end of the post 5 protrudes from the sealing resin layer 4, and a periphery 13 of the protruding portion is shaped so as to oppositely come into contact with the surface of the sealing resin layer 4 in the stacking direction.

More specifically, the post 5 includes an embedded portion 14 embedded in the sealing resin layer 4 and a protrusion 15 connected to this embedded portion 14 and having a tip end protruding from the sealing resin layer 4.

The embedded portion 14 is made of copper, for example. This embedded portion 14 is in the form of a flat pillar (in the form of a column or a prism) having a thickness not protruding from the sealing resin layer 4.

The protrusion 15 is made of nickel, for example. This protrusion 15 has higher rigidity than the metal ball 6. The distal end of this protrusion 15 embedded in the sealing resin layer 4 is in the form of a flat pillar (thickness: 3 to 5 μm, for example) having the same sectional shape (sectional shape cut along a cutting plane perpendicular to the stacking direction) as the embedded portion 14. The tip end (thickness: 3 to 50 μm, for example) of the protrusion 15 protruding from the sealing resin layer 4 is formed such that the width (diameter) in the direction perpendicular to the stacking direction is larger than the width of the distal end in the same direction, and the periphery 13 thereof juts out in the direction perpendicular to the stacking direction. Thus, the periphery 13 of the tip end of the protrusion 15 is oppositely in contact with the surface of the sealing resin layer 4 in the stacking direction. The tip end of the protrusion 15 covers a corner 16 formed by the surface of the sealing resin layer 4 and the inner surface of the through-hole 41.

The metal ball 6 is formed by balling a solder material, for example, and covers the entire exposed surfaces (surface and the side surfaces) of the portion (tip end of the protrusion 15) of the post 5 protruding from the sealing resin layer 4.

Figure 10:
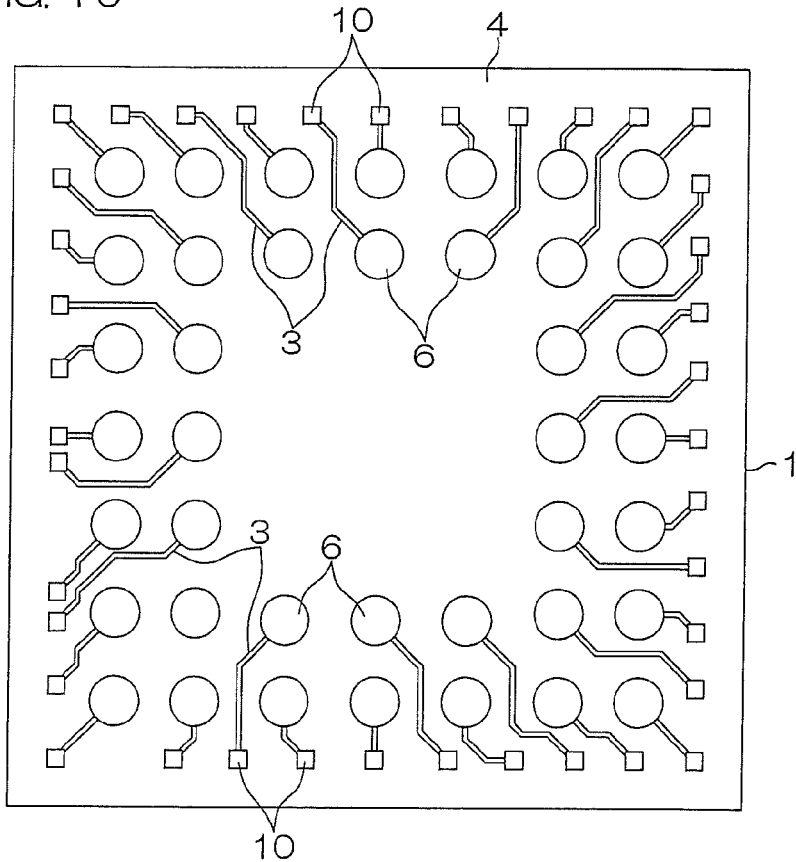
FIG. 10 A plan view schematically showing an example of the arrangement of rewirings, metal balls and electrode pads.

FIG. 10 is a plan view schematically showing an example of the arrangement of the rewirings 3, the metal balls 6 and the electrode pads 10. While the rewirings 3 and the electrode pads 10 are covered with the sealing resin layer 4 and visually unrecognizable when the semiconductor device is completed, FIG. 10 shows them by solid lines. In order to avoid complication of the drawing, the reference numerals are only partially assigned to the rewirings 3, the metal balls 6 and the electrode pads 10 respectively.

The electrode pads 10 are arranged along the outer periphery of the semiconductor chip 1 in the form of a rectangular ring in plan view. Proper intervals are provided between the electrode pads 10 adjacent to one another respectively.

The metal balls 6 are provided in the same number as the electrode pads 10. The metal balls 6 are arranged in a region inward from the electrode pads 10 in the form of two rectangular rings in plan view.

The rewirings 3 connect the electrode pads 10 and the metal balls 6 with each other in a one-to-one correspondence.

The rewirings 3 are formed on the surface of the stress relaxation layer 2 so as not to intersect with one another.

As described above, the periphery 13 of the portion of each post 5 protruding from the sealing resin layer 4 is opposedly in contact with the surface of the sealing resin layer 4 in the stacking direction. Therefore, the corner 16 formed by the surface of the sealing resin layer 4 and the inner surface of the through-hole 41 comes into contact with the boundary between the portion of the post 5 embedded in the sealing resin layer 4 and the portion of the post 5 protruding from the sealing resin layer 4, and is covered with the post 5 (protrusion 15). Therefore, the corner 16 can be prevented from coming into contact with the metal ball 6. Consequently, stress can be prevented from locally concentrating on the metal ball 6 when the semiconductor chip 1 or the mounting board 7 mounted expansion/shrinkage or the like, and the metal ball 6 can be prevented from being damages resulting from such stress concentration.

In the process of manufacturing this semiconductor device, a wafer provided with a plurality of semiconductor chips 1 is prepared. In this wafer state, the stress relaxation layer 2 and the rewirings 3 are first formed on the passivation film 9 covering the surface of the wafer. Thereafter the metallic material forming the embedded portions 14 of the posts 5 is deposited on predetermined positions of the rewirings 3 in the form of pillars by a method such as plating. Then, epoxy resin employed as the material for the sealing resin layer 4 is supplied to the surface of the wafer to embed therein the metallic material deposited in the form of pillars. After the epoxy resin is cured, the surface of the epoxy resin is ground with a grinder, thereby exposing from the epoxy resin the surfaces (tip end surfaces) of the metallic material deposited in the form of pillars. Thus, formation of the sealing resin layer 4 is achieved. Thereafter an etching solution is supplied to the surface of the wafer to remove the tip ends of the metallic material in the form of pillars penetrating the sealing resin layer 4 along with the metallic material extending on the sealing resin layer 4 due to the grinding with the grinder, thereby obtaining the embedded portions 14 having tip end surfaces lower by one step than the surface of the sealing resin layer 4. After this etching, the protrusions 15 are formed on the embedded portions 14 by electroless plating, and the metal balls 6 are further formed on the tip ends thereof. Then, the wafer is cut (diced) along dicing lines set between the respective semiconductor chips 1 in the wafer. Thus, the semiconductor device having the structure shown in FIG. 1 is obtained.

While the embedded portions 14 are made of copper and the protrusions 15 are made of nickel in this embodiment, the embedded portions 14 and the protrusions 15 may be made of other types of metallic materials respectively. As the metallic materials forming the embedded portions 14 and the protrusions 15, silver, gold, cobalt and the like can be listed in addition to copper and nickel. The embedded portions 14 and the protrusions 15 may be made of the same metallic material.

Figure 3:
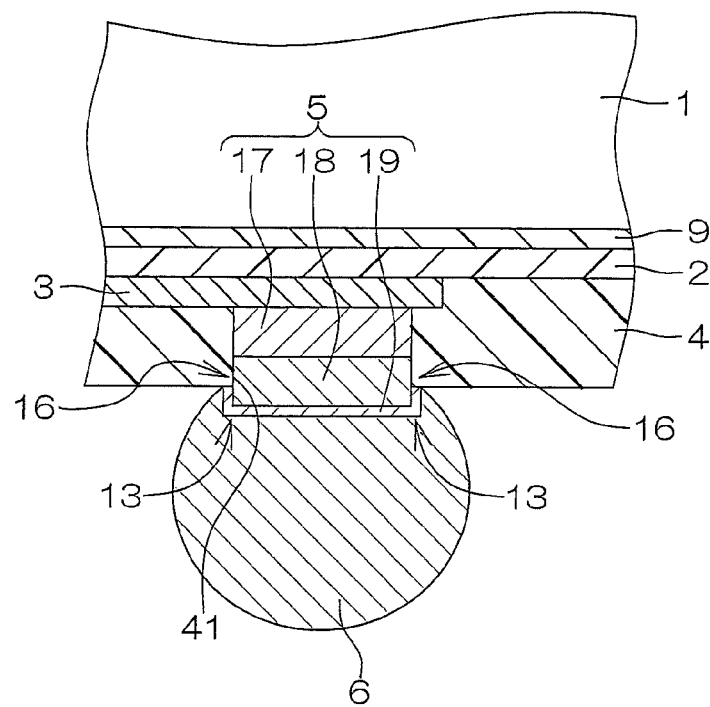
FIG. 3 A schematic sectional view showing another structure (structure having a first columnar portion, a second columnar portion and a cladding portion) of the post.

FIG. 3 is a sectional view showing another structure of each post 5. In FIG. 3, parts corresponding to the respective parts shown in FIG. 2 are denoted by the same reference numerals as those in FIG. 2.

The post 5 shown in FIG. 3 includes a first columnar portion 17 embedded in the sealing resin layer 4, a second columnar portion 18 connected to the first columnar portion and having a tip end protruding from the sealing resin layer, and a cladding portion 19 covering the tip end of the second columnar portion 18.

The first columnar portion 17 is made of copper, for example, and is in the form of a flat pillar (in the form of a column or a prism) having a thickness such that it does not protrude from the sealing resin layer 4.

The second columnar portion 18 is made of nickel, for example, and is in the form of a flat pillar (thickness: 3 to 50 μm, for example) having the same sectional shape (sectional shape cut along a cutting plane perpendicular to the stacking direction) as the first columnar portion 17.

The cladding portion 19 is made of gold, for example, and formed so as to cover the entire exposed surface of the portion of the second columnar portion 18 protruding from the sealing resin layer 4.

According to this structure, the cladding portion 19 opposedly comes into contact with the surface of the sealing resin layer 4 in the stacking direction. Thus, a corner 16 formed by the surface of the sealing resin layer 4 and the inner surface of a through-hole 41 comes into contact with the boundary between the side surface of the second columnar portion 18 and the lower end surface of the cladding portion 19, and is not in contact with the metal ball 6. Therefore, functions and effects similar to those of the structure shown in FIG. 2 can be attained.

Figure 4:
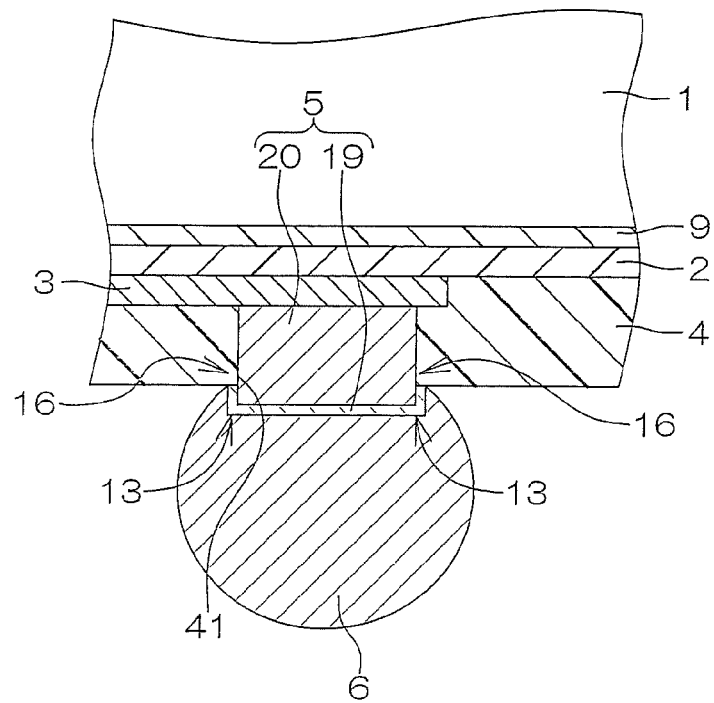
FIG. 4 A schematic sectional view showing still another structure (structure having a columnar portion and a cladding portion) of the post.

The first columnar portion 17 and the second columnar portion 18 may be made of the same metallic material (copper, for example). In this case, the first columnar portion 17 and the second columnar portion 18 are integrated with each other, and form a columnar portion 20 having a tip end protruding from the sealing resin layer 4, as shown in FIG. 4.

Figure 5:
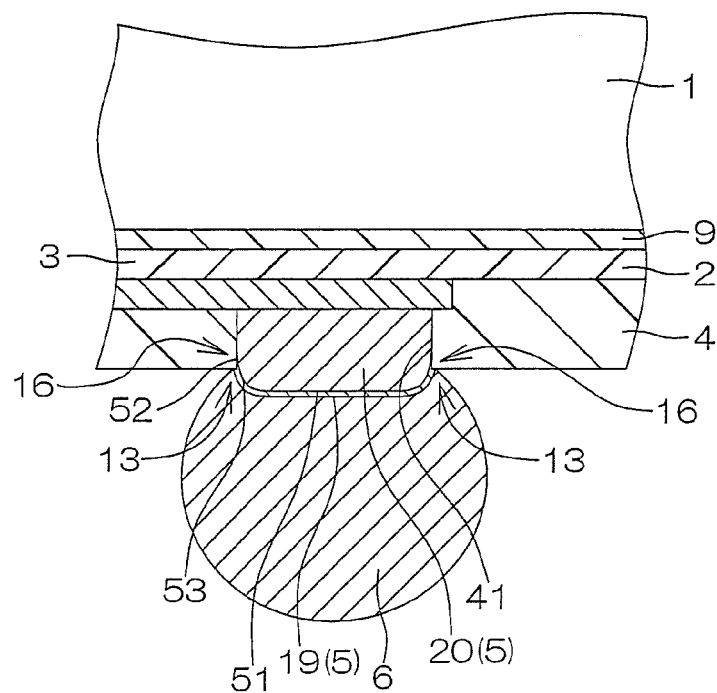
FIG. 5 A schematic sectional view showing a further structure (structure having a cladding portion entering a clearance between a columnar portion and the inner surface of a through-hole) of the post.

This columnar portion 20 may be shaped so as to have a planar tip end surface 51 generally parallel to the surface of the semiconductor chip 1, an inclined side surface 52 tapered toward the tip end (closer to the metal ball 6), and a continuous surface 53 generally arcuate in portion and continuous with the tip end surface 51 and the inclined side surface 52, as shown in FIG. 5. The cladding portion 19 may enter a clearance formed between the continuous surface 53 of the columnar portion 20 and the inner surface of the through-hole 41.

Since the cladding portion 19 enters the clearance between the columnar portion 20 and the inner surface of the through-hole 41, the cladding portion 19 has no right-angled corner in contact with the tip end surface 51 of the columnar portion 20 and the inner surface of the through-hole 41 on the portion connected with the columnar portion 20. Thus, stress can be prevented from locally concentrating on the portion of the cladding portion 19 connected with the columnar portion 20 when the semiconductor chip 1 or the mounting board mounted with this semiconductor device undergoes thermal expansion/shrinkage or the like.

The cladding portion 19 and the columnar portion 20 (the first columnar portion 17 and the second columnar portion 18) may be made of the same metallic material.

Figure 6:
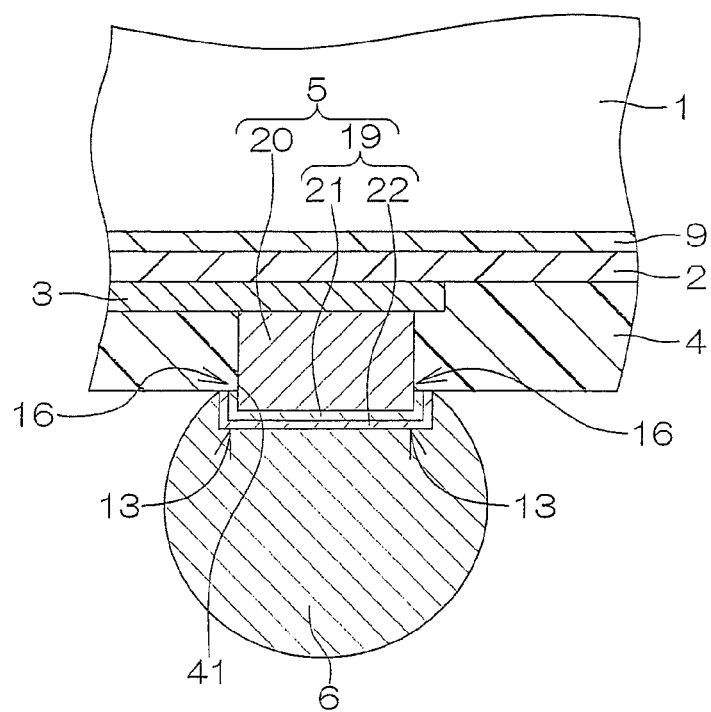
FIG. 6 A schematic sectional view showing a further structure (structure having a columnar portion, a first cladding portion and a second cladding portion) of the post.

Further, the cladding portion 19 may have a first cladding portion 21 covering the tip end of the columnar portion 20 and a second cladding portion 22 covering the surface of this first cladding portion 21, as shown in FIG. 6. In this case, the first cladding portion 21 and the second cladding portion 22 may be made of the same metallic material, or may be made of different metallic materials. For example, the first cladding portion and the second cladding portion may be made of nickel and gold respectively.

Figure 7:
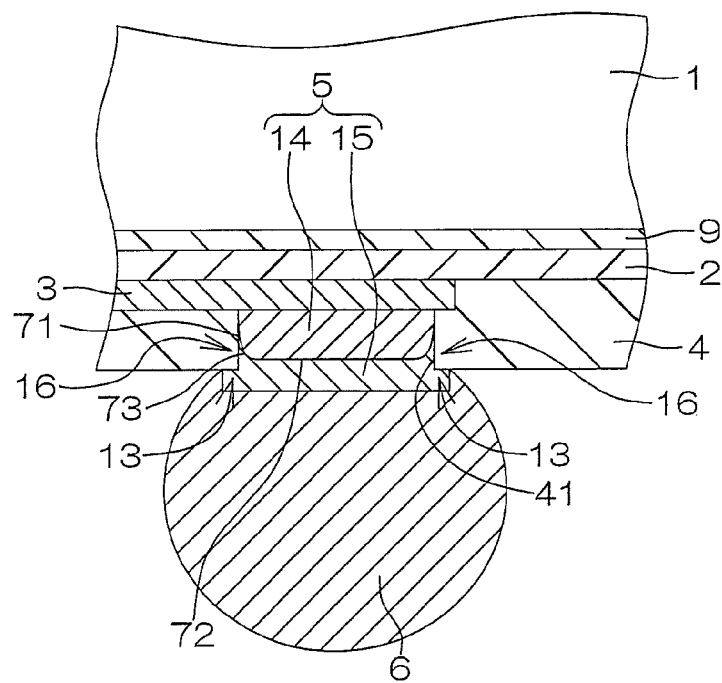
FIG. 7 A schematic sectional view showing a further structure (structure having a protrusion entering a clearance between an embedded portion and the inner surface of a through-hole) of the post.

FIG. 7 is a sectional view showing still another structure of each post 5. In FIG. 7, parts corresponding to the respective parts shown in FIG. 2 are denoted by the same reference numerals as those in FIG. 2.

An embedded portion 14 of the post 5 shown in FIG. 7 is formed in a shape which has a planar tip end surface 71 generally parallel to the surface of the semiconductor chip 1, an inclined side surface 72 inclined so as to form a larger clearance toward the tip end (closer to the protrusion 15) with respect to the inner surface of the through-hole 41, and a continuous surface 73 having a generally arcuate sectional shape along the penetrating direction (direction perpendicular to the surface of the semiconductor chip 1) of the through-hole 41 and making the tip end surface 71 and the inclined side surface 72 continuous with each other. Thus, a clearance gradually expanding toward the tip end of the embedded portion 14 is formed between the continuous surface 73 of the embedded portion 14 and the inner surface of the through-hole 41.

The protrusion 15 enters the clearance between the continuous surface 73 of the embedded portion 14 and the inner surface of the through-hole 41.

Also in this structure shown in FIG. 7, the corner 16 formed by the surface of the sealing resin layer 4 and the inner surface of the through-hole 41 is covered with the tip end of the protrusion 15, whereby functions and effects similar to those of the structure shown in FIG. 2 can be attained.

Since the protrusion 15 enters the clearance between the continuous surface 73 of the embedded portion 14 and the inner surface of the through-hole 41, the protrusion 15 has no right-angled corner in contact with the tip end surface 71 of the embedded portion 14 and the inner surface of the through-hole 41 on the portion connected with the embedded portion 14. Thus, stress can be prevented from locally concentrating on the portion of the protrusion 15 connected with the embedded portion 14 when the semiconductor chip 1 or the mounting board mounted with this semiconductor device undergoes thermal expansion/shrinkage or the like.

Figure 8:
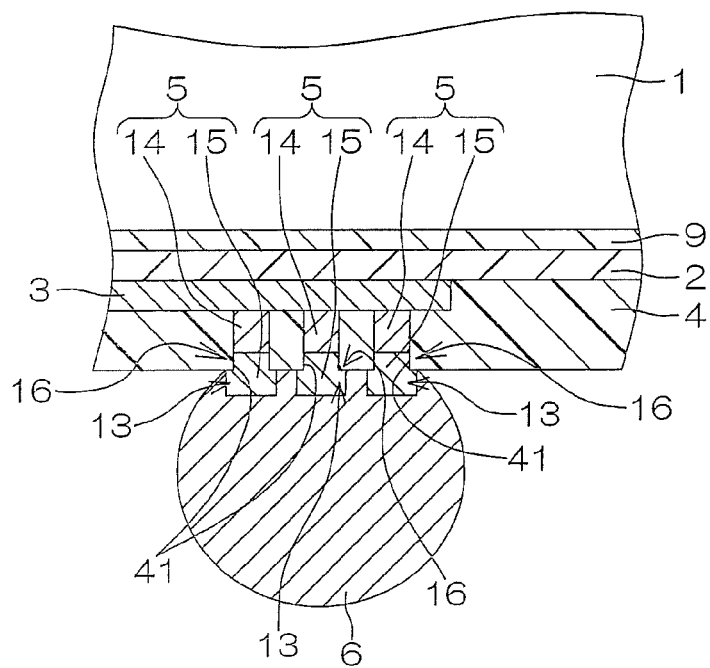
FIG. 8 A sectional view showing another structure (structure provided with a plurality of posts with respect to one metal ball) of the semiconductor device.

FIG. 8 is a sectional view showing another structure of the semiconductor device. In FIG. 8, parts corresponding to the respective parts shown in FIG. 2 are denoted by the same reference numerals as those in FIG. 2.

While one post 5 is provided for one metal ball 6 in the structure shown in FIG. 2, a plurality of posts 5 are provided for one metal ball 6 in the structure shown in FIG. 8.

Also according to this structure shown in FIG. 8, the corner 16 formed by the surface of the sealing resin layer 4 and the inner surface of the through-hole 41 is covered with the tip end of the protrusion 15 of each post 5. Therefore, functions and effects similar to those of the structure shown in FIG. 2 can be attained.

Further, the plurality of posts 5 are provided for one metal ball 6, whereby stress can be dispersed onto the plurality of posts 5 when the semiconductor chip 1 or the mounting board 7 mounted with this semiconductor device undergoes thermal expansion/shrinkage or the like. Consequently, stress resistance can be improved, and reliability for mounting the semiconductor chip 1 on the mounting board 7 can be increased.

Figure 9:
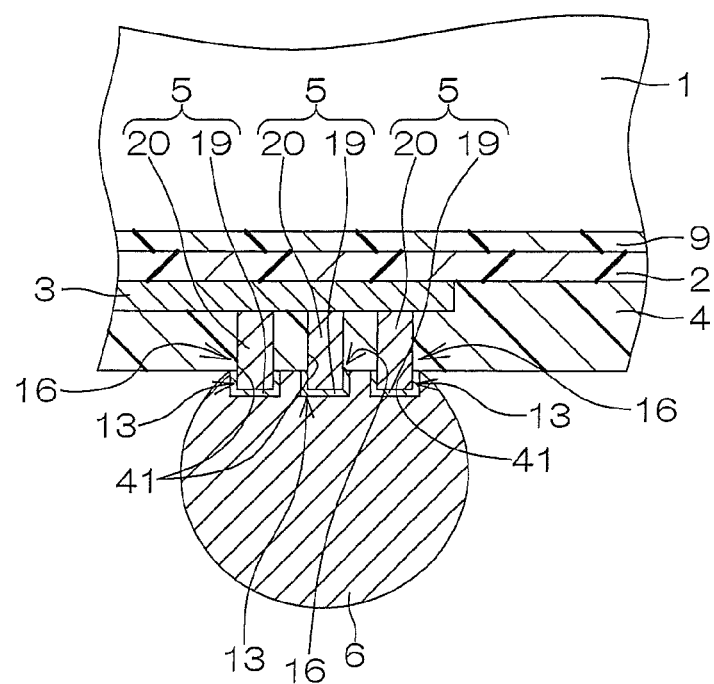
FIG. 9 A sectional view showing another structure (structure having a columnar portion and a cladding portion) of each post in the semiconductor device shown in FIG. 9.

As shown in FIG. 9, each post 5 may have columnar portions 20 in the form of columns having an outer diameter coinciding with the inner diameter of through-holes 41, and cladding portions 19 covering the respective tip ends of the columnar portions 20 protruding from the sealing resin layer 4. According to this structure, corners 16 formed by the surface of the sealing resin layer 4 and the inner surfaces of the through-holes 41 come into contact with the boundaries between the side surfaces of the columnar portions 20 and the lower end surfaces of the cladding portions 19, and are not in contact with the metal balls 6. Therefore, functions and effects similar to those of the structure shown in FIG. 8 can be attained.

Figure 11:
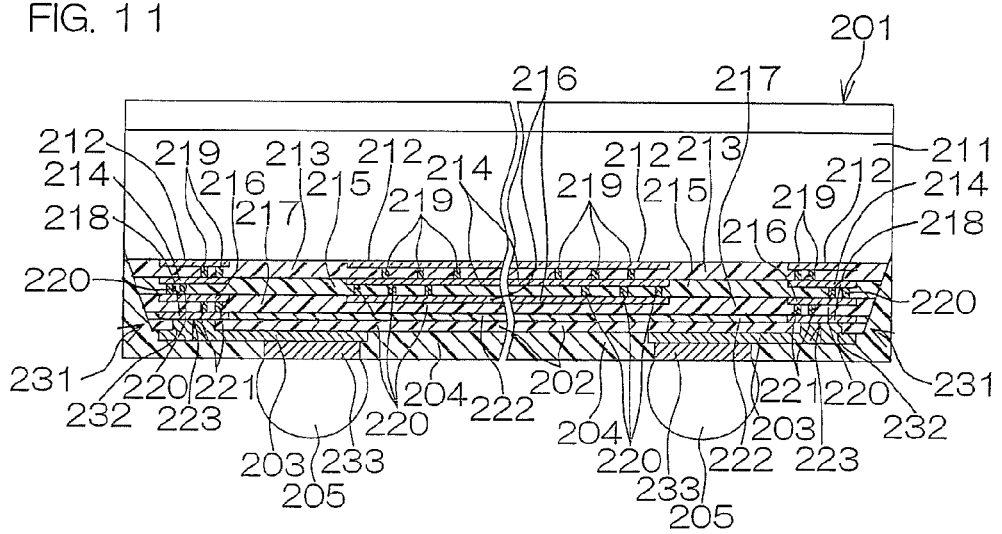
FIG. 11 A sectional view showing the structure of a semiconductor device according to another embodiment of the present invention.

FIG. 11 is a sectional view showing the structure of a semiconductor device according to another embodiment of the present invention. This semiconductor device is prepared by the WL-CSP technique. This semiconductor device includes a semiconductor chip 201, a stress relaxation layer 202 stacked on the semiconductor chip 201, rewirings 203 formed on the stress relaxation layer 202, a sealing resin layer 204 stacked on the rewirings 203 and metal balls 205 arranged on the sealing resin layer 204.

The semiconductor chip 201 has a multilevel interconnection structure. On a semiconductor substrate 211 serving as the base of this semiconductor chip 201, a first wiring layer 212, a first interlayer film 213, a second wiring layer 214, a second interlayer film 215, a third wiring layer 216, a third interlayer film 217 and a fourth wiring layer 218 are stacked in this order from the side closer to the semiconductor substrate 211.

The first wiring layer 212, the second wiring layer 214, the third wiring layer 216 and the fourth wiring layer 218 are formed in designed patterns respectively. The first wiring layer 212 and the second wiring layer 214 are electrically connected with each other through a plurality of via holes 219 formed in the first interlayer film 213. The second wiring layer 214 and the third wiring layer 216 are electrically connected with each other through a plurality of via holes 220 formed in the second interlayer film 215. The third wiring layer 216 and the fourth wiring layer 218 are electrically connected with each other through a plurality of via holes 221 formed in the third interlayer film 217. The surfaces of the third interlayer film 217 and the fourth wiring layer 218 are covered with a passivation film 222 serving as the outermost layer of the semiconductor chip 201. The passivation film 222 is provided with openings for exposing portions of the fourth wiring layer 218 as pads 223.

The semiconductor chip 201 is generally rectangularly formed in plan view. A trench 231 opening toward the surface side and the side surface side is formed along the entire periphery of the surface of the semiconductor chip 201. This trench 231 has a triangular portion reduced in width toward the back surface of the semiconductor chip 201, and the deepest portion (lowest portion) thereof reaches the semiconductor substrate 211. Thus, the side surfaces of the first interlayer film 213, the second interlayer film 215, the third interlayer film 217 and the passivation film 222 are exposed in the trench 231 respectively.

The stress relaxation layer 202 is made of polyimide, for example, and is provided so as to absorb and relax stress applied to this semiconductor device. Through-holes 232 are penetratingly formed in this stress 3 relaxation layer 202 on positions opposed to the pads 223.

The rewirings 203 are connected to the pads 223 through the through-holes 232. Further, the rewirings 203 extend along the surface of the stress relaxation layer 202 toward positions opposed to the metal balls 205 through the sealing resin layer 204.

The sealing resin layer 204 is made of epoxy resin, for example, and seals the surface of this semiconductor device. This sealing resin layer 204 covers the surfaces of the stress relaxation layer 202 and the rewirings 203, enters the trench 231 from these surfaces, and fills up the trench 231. Thus, the side surfaces of the first interlayer film 213, the second interlayer film 215, the third interlayer film 217 and the passivation film 222 are covered with the portion of the sealing resin layer 204 entering the trench 231. The sealing resin layer 204 has a planar surface and a side surface which is flush with the side surface of the semiconductor chip 201. Thus, this semiconductor device is generally in the form of a rectangular parallelepiped having a size equal to the size of the semiconductor chip 201 in plan view.

Further, flat columnar posts 233 made of a metal such as copper are penetratingly provided in the sealing resin layer 204 between the rewirings 203 and the metal balls 205, and the rewirings 203 and the metal balls 205 are connected with each other by these posts 233.

The metal balls 205 are external connecting terminals for connection (external connection) with an unillustrated wiring board or the like, and formed by balling a metallic material such as solder.

As hereinabove described, the trench 231 is formed on the periphery of the surface of the semiconductor chip 201, and the sealing resin layer 204 enters this trench 231. Thus, the side surface of the surface layer portion of the semiconductor chip 201, i.e., the side surfaces of the first interlayer film 213, the second interlayer film 215, the third interlayer film 217 and the passivation film 222 are covered with the sealing resin layer 204 entering the trench 231. Therefore, cracking between each of the first interlayer film 213, the second interlayer film 215, the third interlayer film 217 and the passivation film 222 and the underlayer thereof can be prevented.

Figure 12:
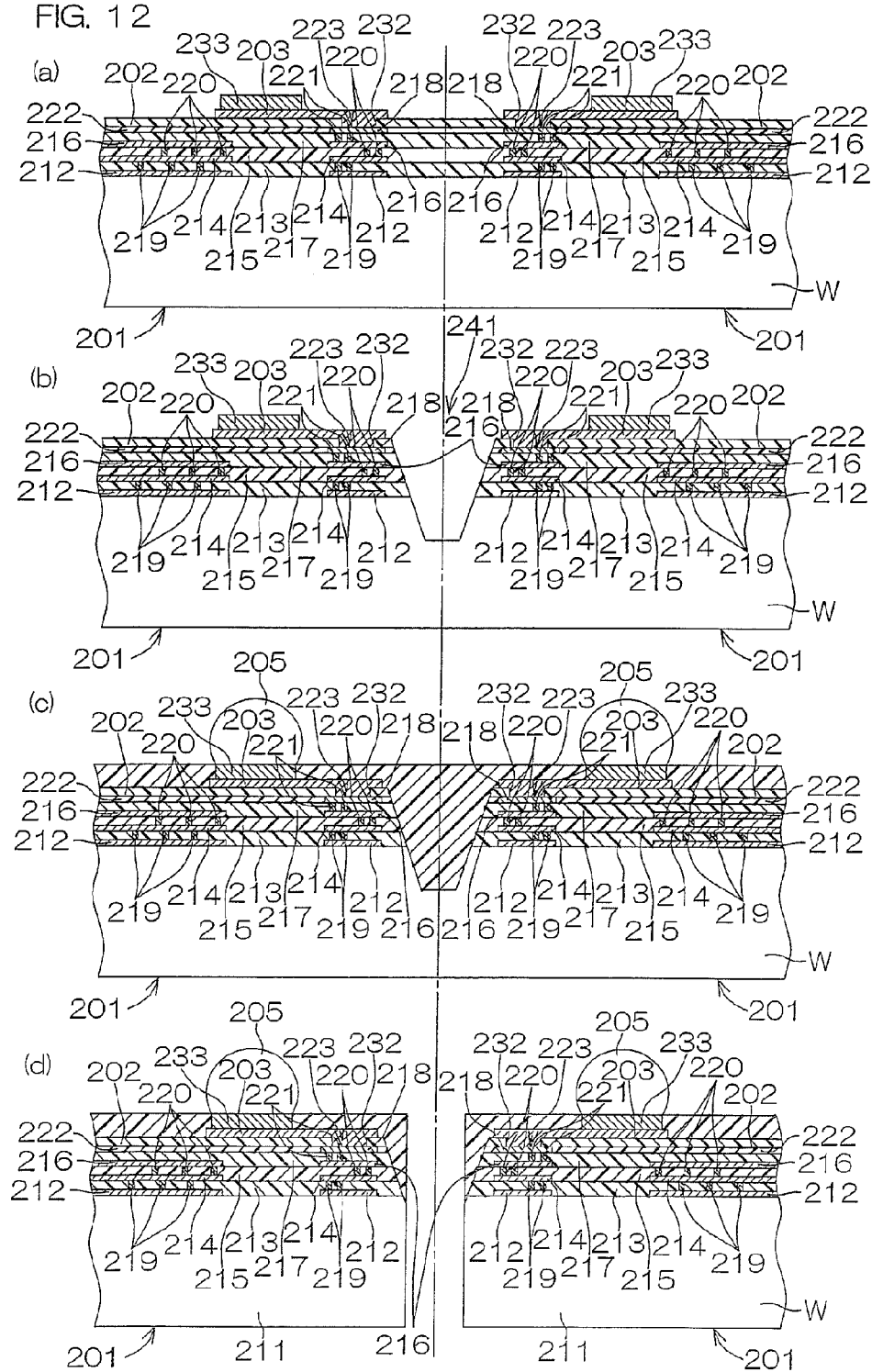
FIG. 12 Sectional views showing the process of manufacturing the semiconductor device shown in FIG. 11 along the steps.
Figure 13:
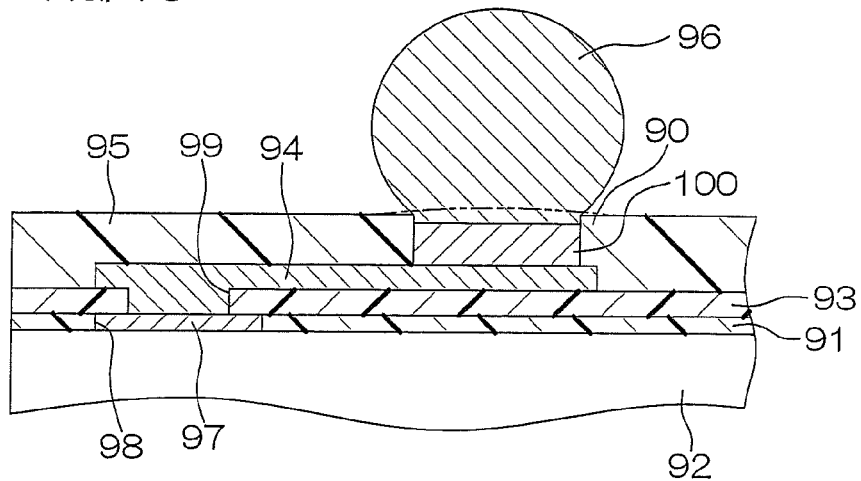
FIG. 13 A schematic sectional view showing the structure of a conventional semiconductor device.
Figure 14:
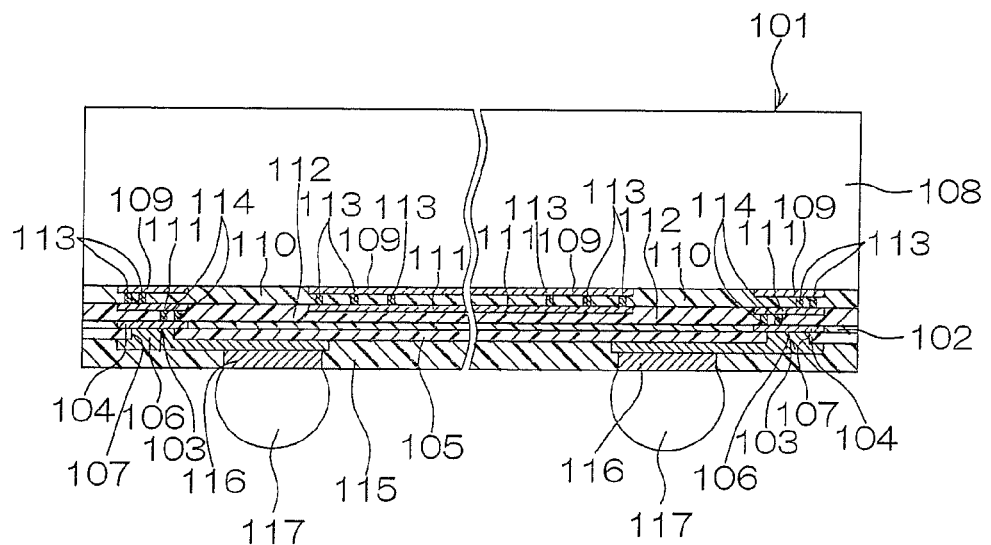
FIG. 14 A schematic sectional view showing the structure of another conventional semiconductor device having a multilevel interconnection structure.

FIG. 12 is sectional views showing the process of manufacturing the semiconductor device shown in FIG. 11 along the steps.

First, a wafer W having a plurality of semiconductor chips 201 whose surfaces are entirely covered with the passivation film 222 is prepared. As shown in FIG. 12(a), the openings for exposing the pads 223 are formed in the passivation film 222. Thereafter the stress relaxation layer 202 and the rewirings 203 are successively formed on the passivation film 222. Further, the plurality of posts 233 are formed on prescribed positions (positions for forming the metal balls 205) of the rewirings 203 by electrolytic plating, for example.

As shown in FIG. 12(b), a cavity 241 having a portion in the form of an inverted trapezoid tapered toward the back surface of the wafer W is formed along a dicing line L from the surface of the stress relaxation layer 202 down to a portion lower than the first wiring layer 212. This cavity 241 may be formed by laser beam machining, for example, or may be formed by half cutting with a blade (not shown) whose peripheral surface has a trapezoidal portion corresponding to the shape of the cavity 241.

Thereafter the sealing resin layer 204 is formed on the entire surface of the wafer W, as shown in FIG. 12(c). This sealing resin layer 204 can be formed by applying uncured liquid epoxy resin to the entire surface of the wafer W, curing the same and thereafter grinding the surface thereof until the posts 233 are exposed. Since the liquid epoxy resin is employed as the material for the sealing resin layer 204, the liquid epoxy resin can excellently enter the spaces between the plurality of posts 233 and the cavity 241. Consequently, the spaces between the plurality of posts 233 and the cavity 241 can be reliably filled up with the sealing resin layer 204.

Subsequently, the metal balls 205 are formed on the respective posts 233. Thereafter the wafer W is cut (diced) along the dicing line L using an unillustrated dicing blade, as shown in FIG. 12(d). Thus, the wafer W is separated into the individual semiconductor chips 201, the cavity 241 is divided into the trenches 231 of the semiconductor chips 201 on both sides of the dicing line L, and thus the semiconductor device having the structure shown in FIG. 11 is obtained.

Various modifications may be made within the scope of the appended claims. It should be understood that the embodiments described above are merely illustrative of the technical principles of the present invention but not limitative of the invention. The spirit and scope of the present invention are to be limited only by the appended claims.

For example, any of the structures shown in FIGS. 2 to 9 may be applied to the semiconductor device shown in FIG. 11.

What is claimed is:

1. A semiconductor device comprising:
a semiconductor chip;
a sealing resin layer stacked on this semiconductor chip, the sealing resin layer having a through-hole;
a post including an embedded portion embedded in the through-hole of the sealing resin layer and a protrusion connected to the embedded portion and having a tip end protruding from the sealing resin layer, a periphery of the protrusion being opposedly in contact with a surface of the sealing resin layer; and
an external connecting terminal provided on the sealing resin layer and connected to the post, wherein
the embedded portion is provided with a clearance between the embedded portion and an inner surface of the through-hole, and
the protrusion enters the clearance between the embedded portion and the inner surface of the through-hole.

2. The semiconductor device according to claim 1, wherein the embedded portion has a planar tip end surface parallel to the surface of the semiconductor chip, an inclined side surface inclined so as to form the larger clearance closer to the protrusion with respect to the inner surface of the through-hole, and a continuous surface making the tip end surface and the inclined side surface continuous with each other.

3. The semiconductor device according to claim 2, wherein the clearance is formed so as to expand toward the tip end of the embedded portion between the continuous surface of the embedded portion and the inner surface of the through-hole.

4. The semiconductor device according to claim 2, wherein the continuous surface has a generally arcuate sectional shape along the penetrating direction of the through-hole.

5. The semiconductor device according to claim 2, wherein the protrusion has no right-angled corner in contact with the tip end surface of the embedded portion and the inner surface of the through-hole on the portion connected with the embedded portion.

6. The semiconductor device according to claim 1, wherein the protrusion has higher rigidity than the external connecting terminal.

7. The semiconductor device according to claim 1, wherein the post further includes a cladding portion covering the tip end of the protrusion.

8. The semiconductor device according to claim 7, wherein the cladding portion has a first cladding portion covering the tip end of the protrusion and a second cladding portion covering a surface of the first cladding portion.

9. The semiconductor device according to claim 1, wherein the semiconductor device is a wafer level chip scale package.

10. The semiconductor device according to claim 1, further comprising a stress relaxation layer stacked on the semiconductor chip.

11. The semiconductor device according to claim 10, wherein the stress relaxation layer has a through-hole exposing an electrode pad formed on the semiconductor chip.

12. The semiconductor device according to claim 11, wherein the external connecting terminal is arranged in a region inward from the plurality of electrode pads formed on the semiconductor chip in plan view.

13. The semiconductor device according to claim 10, wherein the stress relaxation layer includes polyimide.

14. The semiconductor device according to claim 1, wherein the sealing resin layer includes epoxy resin.

15. The semiconductor device according to claim 1, wherein the embedded portion includes copper.

16. The semiconductor device according to claim 1, wherein the embedded portion is in a form of a column or a prism.

17. The semiconductor device according to claim 1, wherein the protrusion includes nickel.

18. The semiconductor device according to claim 1, wherein the protrusion further includes a distal end embedded in the sealing resin layer, the distal end having the same sectional shape as the embedded portion.

19. The semiconductor device according to claim 1, wherein the protrusion further includes a distal end embedded in the sealing resin layer, the distal end having a thickness of 3 to 5 μm.

20. The semiconductor device according to claim 1, wherein the tip end has a thickness of 3 to 50 μm.

21. The semiconductor device according to claim 1, wherein the protrusion further includes a distal end embedded in the sealing resin layer, and the tip end has a width larger than that of the distal end.

22. The semiconductor device according to claim 1, wherein the tip end covers a corner formed by a surface of the sealing resin layer and an inner surface of the through-hole formed in the sealing resin layer.

23. The semiconductor device according to claim 1, wherein the external connecting terminal includes solder material.

24. The semiconductor device according to claim 1, wherein the external connecting terminal covers entire exposed surfaces of the protrusion.

25. The semiconductor device according to claim 1, wherein the embedded portion and the protrusion are made of different metallic material from each other.

26. The semiconductor device according to claim 25, wherein the embedded portion and the protrusion include at least one of silver, gold and cobalt.

27. The semiconductor device according to claim 1, wherein the embedded portion and the protrusion are made of the same metallic material.

\* \* \* \* \*